United States Patent
Park et al.

(10) Patent No.: US 8,847,206 B2
(45) Date of Patent: Sep. 30, 2014

(54) SURFACE MODIFYING AGENT, LAMINATED STRUCTURE AND TRANSISTOR INCLUDING THE SAME, AND METHOD OF MANUFACTURING THE LAMINATED STRUCTURE

(75) Inventors: Jeong-il Park, Seongnam-si (KR); Byung-wook Yoo, Yongin-si (KR); Do-hwan Kim, Seoul (KR); Sang-yoon Lee, Seoul (KR); Bang-lin Lee, Suwon-si (KR); Eun-jeong Jeong, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 589 days.

(21) Appl. No.: 12/656,685

(22) Filed: Feb. 12, 2010

(65) Prior Publication Data

US 2010/0200842 A1    Aug. 12, 2010

(30) Foreign Application Priority Data

Feb. 11, 2009    (KR) .................. 10-2009-0010965

(51) Int. Cl.
    *H01L 29/72* (2006.01)
(52) U.S. Cl.
    USPC ............ 257/40; 257/83; 257/86; 257/94; 257/192; 257/411; 428/411.1; 428/195.1; 428/209; 428/426; 428/457; 428/702; 436/518; 438/99; 427/331; 427/553; 548/110; 548/255; 526/256
(58) Field of Classification Search
    USPC ............ 257/40, 83, 86, 94, 192, 411; 428/195.1, 209, 411.1, 426, 457, 702; 436/518; 438/99; 427/331, 553; 526/256; 548/110, 255
    See application file for complete search history.

(56) References Cited

U.S. PATENT DOCUMENTS

| | | | |
|---|---|---|---|
| 2004/0245550 A1* | 12/2004 | Afzali-Ardakani et al. | .. 257/221 |
| 2005/0099209 A1* | 5/2005 | Luyken et al. | .......... 327/10 |
| 2005/0147755 A1 | 7/2005 | Imori et al. | |
| 2005/0233473 A1* | 10/2005 | Cicero et al. | ........ 436/518 |
| 2007/0264747 A1* | 11/2007 | Yen et al. | ............ 438/99 |
| 2008/0157064 A1* | 7/2008 | Tsai et al. | ............ 257/40 |
| 2008/0290337 A1* | 11/2008 | Halik et al. | ............ 257/40 |

FOREIGN PATENT DOCUMENTS

| | | |
|---|---|---|
| EP | 0322233 A2 * | 6/1989 |
| JP | 2000-282265 | 10/2000 |
| JP | 2005-289055 | 10/2005 |

(Continued)

OTHER PUBLICATIONS

Yilang Wu et al., "A Simple and Efficient Approach to a Printable Silver Conductor for Printed Electronics" Journal of American Chemical Society, vol. 129, No. 7. 2007, pp. 1862-1863.

(Continued)

*Primary Examiner* — Edward Wojciechowicz

(74) *Attorney, Agent, or Firm* — Harness, Dickey & Pierce, P.L.C.

(57) ABSTRACT

Disclosed is a surface modifying agent including a compound having an ethynyl group at one terminal end, a laminated structure manufactured using the surface modifying agent, a method of manufacturing the laminated structure, and a transistor including the same.

40 Claims, 10 Drawing Sheets

(56) References Cited

FOREIGN PATENT DOCUMENTS

| | | |
|---|---|---|
| JP | 2008-060117 | 3/2008 |
| KR | 10-1997-0042700 | 7/1997 |
| KR | 10-1998-7000798 | 3/1998 |
| KR | 10-2004-0105975 | 12/2004 |
| KR | 10-2006-0094339 | 8/2006 |
| KR | 10-2007-0037492 | 4/2007 |
| KR | 10-2008-0072866 | 8/2008 |
| WO | WO 96/19097 | 6/1996 |

OTHER PUBLICATIONS

European Search Report dated Oct. 30, 2012, issued in European Application No. 10153288.5.
European Office Action dated Jul. 18, 2014 for corresponding European Application No. 10 153 288.5.
Bethencourt, et al. "SAMs on Gold Derived from the Direct Adsorption of Alkanethioacetates Are Inferior to Those Derived from the Direct Adsorption of Alkanethiols"; Langmuir, vol. 25, No. 3, pp. 1265-1271; Feb. 2009; XP056128583.

* cited by examiner

SURFACE MODIFYING AGENT, LAMINATED STRUCTURE AND TRANSISTOR INCLUDING THE SAME, AND METHOD OF MANUFACTURING THE LAMINATED STRUCTURE

CROSS-REFERENCE TO RELATED APPLICATION

This application claims priority under U.S.C. §119 to Korean Patent Application No. 10-2009-0010965, filed in the Korean Intellectual Property Office (KIPO) on Feb. 11, 2009, the entire contents of which are incorporated herein by reference.

BACKGROUND

1. Field

Example embodiments relate to a surface modifying agent, a laminated structure and transistor including the same, and a method of manufacturing the laminated structure.

2. Description of the Related Art

Recently, a method of fabricating a microdevice, e.g., a semiconductor device, an integrated circuit, or an organic electro-luminescence display device, has been performed by providing a thin film with a functional material on a substrate in accordance with evaporation, sputtering, and patterning the thin film in accordance with photolithography.

Photolithography may be generally performed by forming a thin film of material for patterning on a substrate; forming a photoresist layer on the thin film; exposing the photoresist layer while covering the photoresist layer with a photomask having a predetermined or given pattern; developing the photoresist layer with a developing solution to provide a photoresist pattern; etching the thin film with a mask of the photoresist pattern; and removing an undesirable region to provide a thin film having a desirable pattern. However, because the photolithography is a complicated process and needs to be carried out in a clean room, there are problems of lower efficiency in terms of energy and material, and higher costs.

As an alternative, a solution process, e.g., printing, dripping, a roll-to-roll process, or inject printing, has been suggested as a patterning method because the solution process may be carried out with a relatively low cost and using a relatively low amount of energy. However, the solution process may be a complicated process and difficult to provide a fine pattern.

SUMMARY

Example embodiments provide a surface modifying agent, a laminated structure and transistor including the same, and a method of manufacturing the laminated structure. Example embodiments provide a surface modifying agent by which the surface characteristics may be differently controlled. Example embodiments provide a laminated structure of which the surface characteristics may be differently controlled using the surface modifying agent. Example embodiments provide a transistor including the laminated structure. Example embodiments provide a method of manufacturing a laminated structure of which the surface characteristics may be differently controlled by using the surface modifying agent.

According to example embodiments, a surface modifying agent may include a compound represented by the following Chemical Formula 1:

[Chemical Formula 1]

wherein, in the above Chemical Formula 1,

L is selected from the group consisting of a $C_1$ to $C_{30}$ alkylene group, a $C_1$ to $C_{30}$ perfluoroalkylene group, a linker represented by the following Chemical Formula 1a, an aromatic group, a heterocyclic group, an amine group, an amide group, an ester group, and combinations thereof,

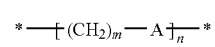

[Chemical Formula 1a]

wherein, in the above Chemical Formula 1a,

A is selected from the group consisting of O, S, $NR_1$, NHCO, $SO_2$, COO, and CO, wherein $R_1$ is hydrogen or a $C_1$ to $C_3$ linear or branched alkyl group, m is an integer ranging from 1 to 3, and n is an integer ranging from 1 to 30, X is selected from the group consisting of a functional group represented by the following Chemical Formula 1b to Chemical Formula 1d, SH, CONHOH, COOH, OH, COSH, COSeH, SeH, $SO_3H$, CN, an amino group, and a phosphinyl group,

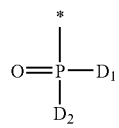

[Chemical Formula 1b]

wherein, in the above Chemical Formula 1b, $D_1$ and $D_2$ are the same or different from each other, and are independently selected from the group consisting of a halogen, a $C_1$ to $C_3$ linear or branched alkoxy group, and OH,

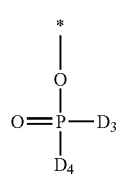

[Chemical Formula 1c]

wherein, in the above Chemical Formula 1c, $D_3$ and $D_4$ are the same or different from each other, and are independently selected from the group consisting of a halogen, OH, a $C_1$ to $C_3$ linear or branched alkoxy group, and $NR_2R_3$, wherein $R_2$ and $R_3$ are the same or different from each other and are independently a $C_1$ to $C_3$ linear or branched alkyl group, and

[Chemical Formula 1c]

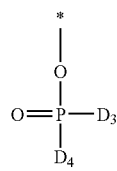

wherein, in the above Chemical Formula 1c, $D_3$ and $D_4$ are the same or different from each other, and are independently selected from the group consisting of a halogen, OH, a $C_1$ to $C_3$ linear or branched alkoxy group, and $NR_2R_3$, wherein $R_2$ and $R_3$ are the same or different from each other and are independently a $C_1$ to $C_3$ linear or branched alkyl group, and

[Chemical Formula 1d]

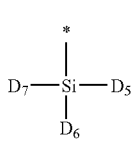

wherein, in the above Chemical Formula 1d, $D_5$ to $D_7$ are the same or different from each other, and are independently selected from the group consisting of a halogen, OH, a $C_1$ to $C_3$ linear or branched alkoxy group, and a $C_1$ to $C_3$ linear or branched alkyl group, provided that $D_5$ to $D_7$ are not simultaneously an alkyl group.

According to example embodiments, a laminated structure may include at least one thin film including a group selected from groups represented by one of Chemical Formula 2 through Chemical Formula 5, or a combination thereof:

[Chemical Formula 2]

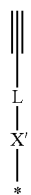

wherein, in the above Chemical Formula 2,

L is selected from the group consisting of a $C_1$ to $C_{30}$ alkylene group, a $C_1$ to $C_{30}$ perfluoroalkylene group, a linker represented by the following Chemical Formula 1a, an aromatic group, a heterocyclic group, an amine group, an amide group, an ester group, and combinations thereof,

[Chemical Formula 1a]

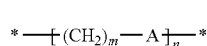

wherein, in the above Chemical Formula 1a,

A is selected from the group consisting of O, S, $NR_1$, NHCO, $SO_2$, COO, and CO, wherein $R_1$ is hydrogen or a $C_1$ to $C_3$ linear or branched alkyl group, m is an integer ranging from 1 to 3, and n is an integer ranging from 1 to 30, X' is a linker formed by binding to a functional group of a surface on which the at least one thin film is formed and is selected from the group consisting of a functional group represented by the following Chemical Formula 1b to Chemical Formula 1d, SH, CONHOH, COOH, OH, COSH, COSeH, SeH, $SO_3H$, CN, an amino group, and a phosphinyl group,

[Chemical Formula 1b]

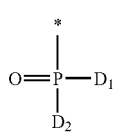

wherein, in the above Chemical Formula 1b, $D_1$ and $D_2$ are the same or different from each other, and are independently selected from the group consisting of a halogen, a $C_1$ to $C_3$ linear or branched alkoxy group, and OH,

[Chemical Formula 1d]

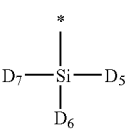

wherein, in the above Chemical Formula 1d, $D_5$ to $D_7$ are the same or different from each other, and are independently selected from the group consisting of a halogen, OH, a $C_1$ to $C_3$ linear or branched alkoxy group, and a $C_1$ to $C_3$ linear or branched alkyl group, provided that $D_5$ to $D_7$ are not simultaneously an alkyl group,

[Chemical Formula 3]

wherein, in the above Chemical Formula 3,

L and X' are the same as defined in the above Chemical Formula 2, and T is an ethyl group or an ethenyl group,

[Chemical Formula 4]

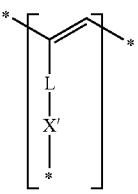

wherein, in the above Chemical Formula 4,

L and X' are the same as defined in the above Chemical Formula 2,

[Chemical Formula 5]

wherein, in the above Chemical Formula 5,

L and X' are the same as defined in the above Chemical Formula 2, and Z is selected from the group consisting of a triazole group, a benzotriazole group, an imidazole group, a benzimidazole group, a tetrazole group, a pyridine group, a pyrazole group, an isoxazole group, and an indolizinone group.

The at least one thin film may include first and second thin films, the second thin film on a surface of the first thin film. The second thin film may include at least two regions having different surface characteristics from each other. The first thin film may include an inorganic material, an organic material, or a composite of an inorganic material and an organic material. The organic material may include plastic and the inorganic material may include at least one of a glass and a metal.

The first thin film may include one selected from the group consisting of silicon (Si), aluminum (Al), indium (In), tin (Sn), zirconium (Zr), hafnium (Hf), lanthanum (La), gadolinium (Gd), yttrium (Y), titanium (Ti), a combination thereof, and an oxide thereof. The first and second thin films may be on a substrate, the substrate being formed of the same material as the first thin film.

The at least two regions may include first and second regions, the first region having a group represented by Chemical Formula 3 and a second region having a group represented by Chemical Formula 2. A surface of the first region may be treated with $H_2$ plasma and a surface of the second region may not be treated with $H_2$ plasma. The at least two regions may include first and second regions, the first region having a group represented by Chemical Formula 3 and a second region having a group represented by Chemical Formula 5.

A surface of the second region may include a heterocyclized surface and the first region includes a non-heterocyclized surface. The laminated structure may further include a metal layer on the heterocyclized second region, the metal layer including at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb). The laminated structure may further include an organic material bound to the non-heterocyclized first region, the organic material including at least one of pentacene, heteroacene, oligothiophenes, polythiophenes, polyphenylenevinylene and arylene carbodiimides.

The at least two regions may include first and second regions, the first region having a group represented by Chemical Formula 4 and a second region having a group represented by Chemical Formula 2. The first region may include a UV light-treated surface and the second region may include a non-UV light-treated surface. The at least two regions may include first and second regions, the first region having a group represented by Chemical Formula 4 and a second region having a group represented by Chemical Formula 5. A surface of the second region may include a heterocyclized surface and the first region may include a non-heterocyclized surface.

According to example embodiments, a transistor may include at least one thin film having a first region including a group represented by the one of the following Chemical Formula 3 and the following Chemical Formula 4, and a second region including a group represented by the following Chemical Formula 5, a metal layer on the second region, and an organic semiconductor on the first region.

[Chemical Formula 3]

wherein, in the above Chemical Formula 3,

L is selected from the group consisting of a $C_1$ to $C_{30}$ alkylene group, a $C_1$ to $C_{30}$ perfluoroalkylene group, a linker represented by the following Chemical Formula 1a, an aromatic group, a heterocyclic group, an amine group, an amide group, an ester group, and combinations thereof,

[Chemical Formula 1a]

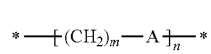

wherein, in the above Chemical Formula 1a,

A is selected from the group consisting of O, S, $NR_1$, NHCO, $SO_2$, COO, and CO, wherein $R_1$ is hydrogen or a $C_1$ to $C_3$ linear or branched alkyl group, m is an integer ranging from 1 to 3, and n is an integer ranging from 1 to 30, X' is a linker formed by binding to a functional group of a surface on which the at least one thin film is formed and is selected from the group consisting of a functional group represented by the following Chemical Formula 1b to Chemical Formula 1d, SH, CONHOH, COOH, OH, COSH, COSeH, SeH, $SO_3H$, CN, an amino group, and a phosphinyl group,

[Chemical Formula 1b]

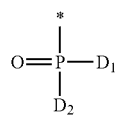

wherein, in the above Chemical Formula 1b, $D_1$ and $D_2$ are the same or different from each other, and are independently selected from the group consisting of a halogen, a $C_1$ to $C_3$ linear or branched alkoxy group, and OH,

[Chemical Formula 1c]

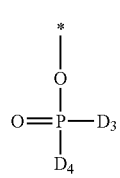

wherein, in the above Chemical Formula 1c, $D_3$ and $D_4$ are the same or different from each other, and are independently selected from the group consisting of a halogen, OH, a $C_1$ to $C_3$ linear or branched alkoxy group, and $NR_2R_3$, wherein $R_2$ and $R_3$ are the same or different from each other and are independently a $C_1$ to $C_3$ linear or branched alkyl group, and

[Chemical Formula 1d]

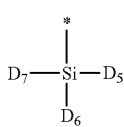

wherein, in the above Chemical Formula 1d, $D_5$ to $D_7$ are the same or different from each other, and are independently selected from the group consisting of a halogen, OH, a $C_1$ to $C_3$ linear or branched alkoxy group, and a $C_1$ to $C_3$ linear or branched alkyl group, provided that $D_5$ to $D_7$ are not simultaneously an alkyl group, and T is an ethyl group or an ethenyl group,

[Chemical Formula 4]

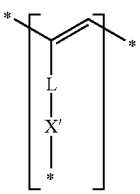

wherein, in the above Chemical Formula 4,

L and X' are the same as defined in the above Chemical Formula 3,

[Chemical Formula 5]

wherein, in the above Chemical Formula 5,

L and X' are the same as defined in the above Chemical Formula 3, and Z is selected from the group consisting of a triazole group, a benzotriazole group, an imidazole group, a benzimidazole group, a tetrazole group, a pyridine group, a pyrazole group, an isoxazole group, and an indolizinone group.

The at least one thin film may include first and second thin films, the second thin film on a surface of the first thin film. The first and second regions may have different surface characteristics from each other. The first thin film may include an inorganic material, an organic material, or a composite of an inorganic material and an organic material. The organic material may include plastic and the inorganic material may include at least one of a glass and a metal.

The first thin film may include one selected from the group consisting of silicon (Si), aluminum (Al), indium (In), tin (Sn), zirconium (Zr), hafnium (Hf), lanthanum (La), gadolinium (Gd), yttrium (Y), titanium (Ti), a combination thereof, and an oxide thereof. The first and second thin films may be on a substrate, the substrate being formed of the same material as the first thin film. The first region may have a group represented by Chemical Formula 3 and the second region may have a group represented by Chemical Formula 5.

A surface of the second region may include a heterocyclized surface and the first region may include a non-heterocyclized surface. The transistor may further include a metal layer on the heterocyclized second region, the metal layer including at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb).

The transistor may further include an organic material bound to the non-heterocyclized first region, the organic material including at least one of pentacene, heteroacene, oligothiophenes, polythiophenes, polyphenylenevinylene and arylene carbodiimides. The first region may have a group represented by Chemical Formula 4 and the second region may have a group represented by Chemical Formula 5. A surface of the second region may include a heterocyclized surface and the first region may include a non-heterocyclized surface.

The organic semiconductor may be on a gate electrode and a gate insulating layer may be between the organic semiconductor and the gate electrode. The transistor may further include a gate electrode on the organic semiconductor, and a gate insulating layer between the organic semiconductor and the gate electrode. The metal layer may include at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb).

According to example embodiments, a method of manufacturing a laminated structure may include forming at least one thin film having a group represented by the following Chemical Formula 2 to Chemical Formula 5, or a combination thereof, and performing a surface treatment on a first region of the at least one thin film,

[Chemical Formula 2]

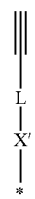

wherein, in the above Chemical Formula 2,

L is selected from the group consisting of a $C_1$ to $C_{30}$ alkylene group, a $C_1$ to $C_{30}$ perfluoroalkylene group, a linker represented by the following Chemical Formula 1a, an aromatic group, a heterocyclic group, an amine group, an amide group, an ester group, and combinations thereof,

[Chemical Formula 1a]

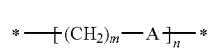

wherein, in the above Chemical Formula 1a,

A is selected from the group consisting of O, S, $NR_1$, NHCO, $SO_2$, COO, and CO, wherein $R_1$ is hydrogen or a $C_1$ to $C_3$ linear or branched alkyl group, m is an integer ranging from 1 to 3, and n is an integer ranging from 1 to 30, X' is a linker formed by binding to a functional group of a surface on which the at least one thin film is formed and is selected from the group consisting of a functional group represented by the following Chemical Formula 1b to Chemical Formula 1d, SH, CONHOH, COOH, OH, COSH, COSeH, SeH, SO$_3$H, CN, an amino group, and a phosphinyl group,

[Chemical Formula 1b]

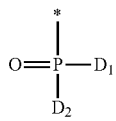

wherein, in the above Chemical Formula 1b,

D$_1$ and D$_2$ are the same or different from each other, and are independently selected from the group consisting of a halogen, a C$_1$ to C$_3$ linear or branched alkoxy group, and OH,

[Chemical Formula 1c]

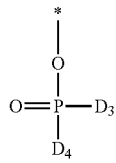

wherein, in the above Chemical Formula 1c,

D$_3$ and D$_4$ are the same or different from each other, and are independently selected from the group consisting of a halogen, OH, a C$_1$ to C$_3$ linear or branched alkoxy group, and NR$_2$R$_3$, wherein R$_2$ and R$_3$ are the same or different from each other and are independently a C$_1$ to C$_3$ linear or branched alkyl group, and

[Chemical Formula 1d]

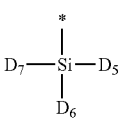

wherein, in the above Chemical Formula 1d,

D$_5$ to D$_7$ are the same or different from each other, and are independently selected from the group consisting of a halogen, OH, a C$_1$ to C$_3$ linear or branched alkoxy group, and a C$_1$ to C$_3$ linear or branched alkyl group, provided that D$_5$ to D$_7$ are not simultaneously an alkyl group,

[Chemical Formula 3]

wherein, in the above Chemical Formula 3,

L and X' are the same as defined in the above Chemical Formula 2, and T is an ethyl group or an ethenyl group,

[Chemical Formula 4]

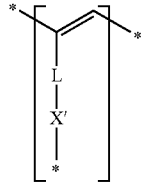

wherein, in the above Chemical Formula 4,

L and X' are the same as defined in the above Chemical Formula 2,

[Chemical Formula 5]

wherein, in the above Chemical Formula 5,

L and X' are the same as defined in the above Chemical Formula 2, and Z is selected from the group consisting of a triazole group, a benzotriazole group, an imidazole group, a benzimidazole group, a tetrazole group, a pyridine group, a pyrazole group, an isoxazole group, and an indolizinone group.

Forming the at least one thin film may include forming a second thin film on a surface of the first thin film and the surface treatment may be performed on the first region of the second thin film. Performing the surface treatment may include exposing the first region of the second thin film to H$_2$ plasma or ultraviolet (UV) light. The method may further include heterocyclizing a second region of the second thin film not subjected to the surface treatment after performing the surface treatment. Heterocyclizing the second region of the second thin film may include Huisgen 1,3-dipolar cycloaddition.

The method may further include forming the first thin film on a substrate, the substrate being formed of the same material as the first thin film. A surface of the first region of the second thin film may be exposed to H$_2$ plasma using a mask and a surface of the second region may not be exposed to H$_2$ plasma, the first region having a group represented by Chemical Formula 3 and the second region having a group represented by Chemical Formula 2.

The method may further include forming a metal layer on the heterocyclized second region, the metal layer including at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb). A surface of the first region may be exposed to ultraviolet (UV) light using a mask and a surface of the second region may not be exposed to UV light, the first region having a group represented by Chemical Formula 4 and the second region having a group represented by Chemical Formula 2. Hereinafter, further aspects of example embodiments will be described in detail.

BRIEF DESCRIPTION OF THE DRAWINGS

Example embodiments will be more clearly understood from the following detailed description taken in conjunction with the accompanying drawings. FIGS. 1-11C represent non-limiting, example embodiments as described herein.

FIGS. 1-4 are cross-sectional views of a laminated structure according to example embodiments.

FIGS. 5(a)-5(c) and FIGS. 6(a)-6(c) are schematic cross-sectional views showing a process of manufacturing a laminated structure according to example embodiments.

FIGS. 7-8 are schematic cross-sectional views of a transistor according to example embodiments.

FIG. 9 shows Raman spectra before and after the $H_2$ plasma treatment in Example 1.

FIG. 11C is a graph showing $I_{DS}$-$V_{GS}$ curves of the transistor obtained from Example 5.

Figure 1:
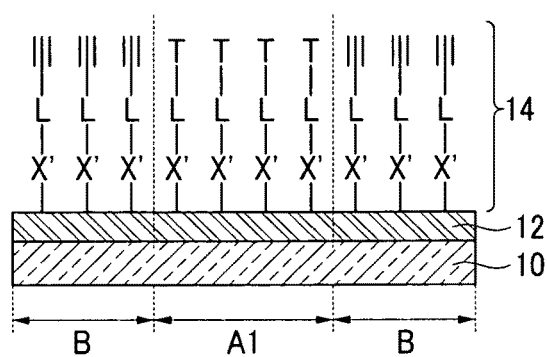

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will be described more fully hereinafter in the following detailed description of example embodiments, in which some but not all example embodiments are described. Example embodiments may be embodied in many different forms and is not construed as limited to example embodiments set forth herein; rather, example embodiments are provided so that this disclosure will satisfy applicable legal requirements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein is to be interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes", and/or "including" when used in this application, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, when a definition is not provided, the term "an aromatic group" refers to a $C_6$ to $C_{30}$ aromatic functional group, and the aromatic group may be optionally substituted with a $C_1$ to $C_7$ alkyl group; and the term "a heterocyclic group" refers to a $C_3$ to $C_{30}$ heteroaryl group, a $C_3$ to $C_{30}$ heterocycloalkyl group, a $C_3$ to $C_{30}$ heterocycloalkenyl group, or a $C_3$ to $C_{30}$ heterocycloalkynyl group, where the term "hetero" refers to a compound including 1 to 3 hetero atoms selected from the group consisting of N, O, S, Si, and P in one ring. The term "an amine group" refers to an amine group including a $C_1$ to $C_7$ alkyl group, and the term "an amide group" refers to an amide group including a $C_1$ to $C_7$ alkyl group. In addition, "*" refers to a part connecting the same or different atoms or chemical formulae.

According to example embodiments, a surface modifying agent may be provided that may include a compound represented by the following Chemical Formula 1.

[Chemical Formula 1]

In the above Chemical Formula 1,

L may be selected from the group consisting of a $C_1$ to $C_{30}$ alkylene group, a $C_1$ to $C_{30}$ perfluoroalkylene group, a linker represented by the following Chemical Formula 1a, an aromatic group, a heterocyclic group, an amine group, an amide group, an ester group, and combinations thereof. The ethynyl group may be in plural depending upon the bonding number of L.

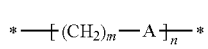

[Chemical Formula 1a]

In the above Chemical Formula 1a,

A may be selected from the group consisting of O, S, $NR_1$, NHCO, $SO_2$, COO, and CO, where $R_1$ may be hydrogen or a $C_1$ to $C_3$ linear or branched alkyl group, m may be an integer ranging from 1 to 3, and n may be an integer ranging from 1 to 30, and X may be selected from the group consisting of a functional group represented by the following Chemical Formula 1b to Chemical Formula 1d, SH, CONHOH, COOH, OH, COSH, COSeH, SeH, $SO_3H$, CN, an amino group, and a phosphinyl group.

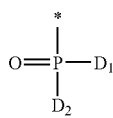

[Chemical Formula 1b]

In the above Chemical Formula 1b, $D_1$ and $D_2$ may be the same or different from each other, and may be independently selected from the group consisting of a halogen, a $C_1$ to $C_3$ linear or branched alkoxy group, and OH.

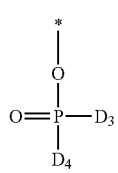

[Chemical Formula 1c]

In the above Chemical Formula 1c, $D_3$ and $D_4$ may be the same or different from each other, and may be independently selected from the group consisting of a halogen, OH, a $C_1$ to $C_3$ linear or branched alkoxy group, and $NR_2R_3$, where $R_2$ and $R_3$ may be the same or different from each other, and may be independently a $C_1$ to $C_3$ linear or branched alkyl group.

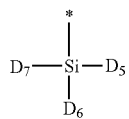

[Chemical Formula 1d]

In the above Chemical Formula 1d, $D_5$ to $D_7$ may be the same or different from each other, and may be independently selected from the group consisting of a halogen, OH, a $C_1$ to $C_3$ linear or branched alkoxy group, and a $C_1$ to $C_3$ linear or branched alkyl group, provided that $D_5$ to $D_7$ may not all independently be an alkyl group.

An ethynyl group at one terminal end of the compound represented by Chemical Formula 1 may be selectively reduced to an ethyl group or an ethenyl group in a region where an exterior stimulus, e.g., $H_2$ plasma exposure, may be applied.

In addition, an ethynyl group at one terminal end of the compound represented by Chemical Formula 1 may be selectively polymerized in a region that may be applied with the exterior stimulus, e.g., ultraviolet light exposure, to be modified to a functional group represented by the following Chemical Formula 4a. Accordingly, the surface characteristics of the laminated structure may be selectively controlled to be different.

[Chemical Formula 4a]

In the above Chemical Formula 1, L may be a linker and plays a role of connecting the ethynyl group of one terminal end with the functional group X of the other terminal end. Non-limiting examples of L may be as mentioned above.

In the above Chemical Formula 1, X plays a role of connecting the surface modifying agent with a substrate or a surface of a thin film formed on the substrate. When an oxide layer may be formed on the substrate or the thin film formed on the substrate, X connects the surface modifying agent with the surface of the oxide layer.

X may be a functional group that may be compatible with a metal or a metal oxide, and non-limiting examples of X may be as mentioned above.

According to example embodiments, a thin film may be provided that may include a group selected from groups represented by Chemical Formula 2 to Chemical Formula 5, or a combination thereof. The surface positioned under the thin film may include any material, for example, a surface of a substrate made of glass, plastic, or an organic compound, or a surface of another thin film formed on the substrate. Non-limiting examples of the thin film may include a self-assembled monolayer (SAM), but may not be limited thereto.

[Chemical Formula 2]

In the above Chemical Formula 2, L may be the same as defined in the above Chemical Formula 1, and X' is a linker formed by binding X of the above Chemical Formula 1 and a functional group of the surface.

[Chemical Formula 3]

In the above Chemical Formula 3, L and X' may be defined the same as in the above Chemical Formula 2, and T may be an ethyl group or an ethenyl group.

[Chemical Formula 4]

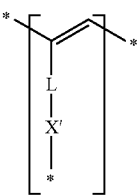

In the above Chemical Formula 4, L and X' may be the same as defined in the above Chemical Formula 2.

[Chemical Formula 5]

In the above Chemical Formula 5, L and X' may be the same as defined in the above Chemical Formula 2, and Z may be selected from the group consisting of a triazole group, a benzotriazole group, an imidazole group, a benzimidazole group, a tetrazole group, a pyridine group, a pyrazole group, an isoxazole group, and an indolizinone group.

Non-limiting examples of the triazole group may include a functional group represented by the following Chemical Formula 6.

[Chemical Formula 6]

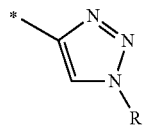

In the above Chemical Formula 6, R may be selected from the group consisting of hydrogen, a $C_1$ to $C_{30}$ alkyl group, an aromatic group, a heterocyclic group, an amine group, an amide group, an ester group, and combinations thereof. In addition, R may increase hydrophilicity by further including a substituent of carboxylic acid group, phosphoric acid group, sulfonic acid group, an amine group, aziridinium group, or crown ether group.

Hereinafter, the laminated structure will be described with reference to FIG. 1 to FIG. 4. FIG. 1 is a cross-sectional view showing the laminated structure according to example embodiments.

As shown in FIG. 1, the laminated structure according to example embodiments may include a substrate 10, a lower layer 12 positioned on the substrate 10, and an upper layer 14 positioned on the lower layer 12.

The substrate 10 may include an inorganic material, an organic material, or a composite of an inorganic material and an organic material. The organic material may include plastic, and the inorganic material may include glass, silicon (Si), or a metal. Non-limiting examples of the metal may be selected from the group consisting of silicon (Si), aluminum (Al), indium (In), tin (Sn), zirconium (Zr), hafnium (Hf), lanthanum (La), gadolinium (Gd), yttrium (Y), titanium (Ti), and a combination thereof.

The lower layer 12 may include one selected from the group consisting of silicon (Si), aluminum (Al), indium (In), tin (Sn), zirconium (Zr), hafnium (Hf), lanthanum (La), gadolinium (Gd), yttrium (Y), titanium (Ti), a combination thereof, and an oxide thereof.

The upper layer 14 may include a first region A1 having a group represented by Chemical Formula 3, and a second region B having a group represented by Chemical Formula 2. The first region A1 may be a region where the surface may be treated by exposing the group represented by Chemical Formula 2 to $H_2$ plasma, and the second region B may be a region where the surface may not be treated.

The group represented by Chemical Formula 2 may include an ethynyl group at one terminal end, and the group represented by Chemical Formula 3 may include an ethyl group or an ethenyl group at one terminal end.

The ethynyl group has different characteristics from the ethyl group and the ethenyl group. The ethynyl group has improved reactivity in heterocyclization, and the ethyl group and the ethenyl group do not participate in heterocyclization. Subsequently, the ethynyl group may be selectively transferred to the heterocyclic group through heterocyclization. Accordingly, the laminated structure may have at least two regions where the surface characteristics may be different from each other.

Figure 2:
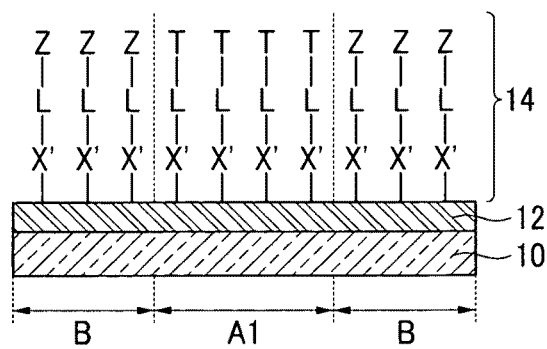

FIG. 2 is a cross-sectional view illustrating a laminated structure according to example embodiments. A description of the same parts as in the laminated structure shown in FIG. 1 will be omitted.

As shown in FIG. 2, the upper layer 14 may include a first region A1 including the group represented by Chemical Formula 3, and a second region B including the group represented by Chemical Formula 5. The second region B may be a region that is heterocyclized, and the first region A1 may be a region that is not heterocyclized.

The laminated structure may include a heterocyclic group at one terminal end of the group represented by Chemical Formula 5, and the laminated structure may include an ethyl group or an ethenyl group at one terminal end of the group represented by Chemical Formula 3.

The heterocyclic group has different characteristics from the ethyl group and the ethenyl group. The heterocyclic group may be compatible with a metal, thus selectively forming a metal layer thereon. Thereby, the laminated structure selectively forms a metal layer only on a predetermined or given region depending upon the differences of surface characteristics. Non-limiting examples of the metal for the metal layer may be at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb).

On the other hand, the ethyl group and the ethenyl group may be less compatible with a metal and more compatible with an organic material, so selectively binding an organic material thereto may be possible. Thereby, the laminated structure may selectively form an organic material only on a predetermined or given region using the differences of surface characteristics. The organic material may include any organic low molecular material or organic high molecular material as long as the material has semiconductor characteristics, and non-limiting examples thereof may include pentacene, heteroacene, oligothiophenes, polythiophenes, polyphenylenevinylene, and arylene carbodiimides.

Thereby, selectively providing the heterocyclic group with a hydrophilic material and the ethyl group or the ethenyl group with a hydrophobic material may be possible. In addition, increasing hydrophilicity of the heterocyclic group by changing a substituent of the heterocyclic group to a strongly hydrophilic group may be possible.

Figure 3:
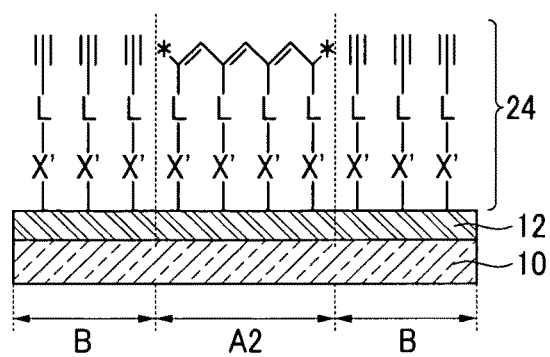

FIG. 3 is a cross-sectional view illustrating a laminated structure according to example embodiments. Description of the same parts as in the laminated structure shown in FIG. 1 and FIG. 2 will be omitted.

As shown in FIG. 3, an upper layer 24 may include a first region A2 including the group represented by Chemical Formula 4, and a second region B including the group represented by Chemical Formula 2. The first region A2 may be a region where the surface may be treated by exposing the group represented by Chemical Formula 2 to ultraviolet (UV) light, and the second region B may be a region where the surface may not be treated. The laminated structure may include an ethynyl group at one terminal end of the group represented by Chemical Formula 2, and the group represented by Chemical Formula 4a at the one terminal end of the group represented by Chemical Formula 4. The ethynyl group has different characteristics from the group represented by Chemical Formula 4a. Accordingly, the laminated structure has different surface characteristics.

The group represented by Chemical Formula 4a has similar chemical characteristics to an ethyl group or an ethenyl group, and a description thereof will be omitted.

Figure 4:
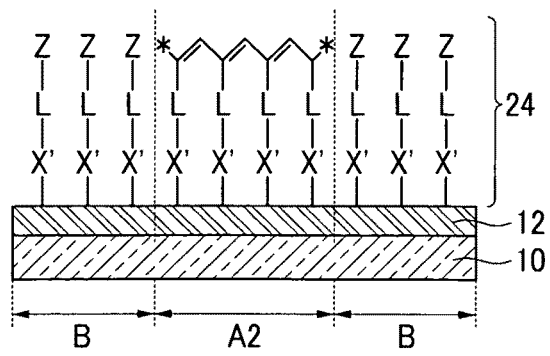

FIG. 4 is a cross-sectional view illustrating the laminated structure according to example embodiments. Description on the same parts as in the laminated structure shown in FIG. 1 to FIG. 3 will be omitted.

As shown in FIG. 4, an upper layer 24 may include a first region A2 including the group represented by Chemical Formula 4, and a second region B including the group represented by Chemical Formula 5. The second region B may be a heterocyclized region, and the first region A2 may be a region that may not be heterocyclized. Accordingly, the laminated structure has different surface characteristics.

The laminated structure shown in FIG. 1 to FIG. 4 may be formed without the lower layer 12. In example embodiments, the upper layer 14 or 24 may be formed directly on the substrate 10. The functional group X of the compound represented by Chemical Formula 1 may be included in the surface modifying agent and may be bound with the functional group present in the surface of the substrate 10 to provide X' of Chemical Formulae 2 to 5.

Because the laminated structure has different surface characteristics, forming two different material layers on one upper layer at the same time or at different times may be possible. The process of forming different material layers may be carried out in a solution process. In example embodiments, the laminated structure does not require a bank or additional processes. Thereby, the laminated structure may be applied to various fields requiring patterning using a difference of surface characteristics of a thin film in a semiconductor device, electrical device, biochip, and biosensor fields.

Hereinafter, a method of manufacturing the laminated structure according to example embodiments will be described. According to example embodiments, a method of manufacturing a laminated structure may include forming a thin film including a group represented by Chemical Formula 2 on a surface thereof, and subjecting a predetermined or given region of the thin film to a surface treatment.

Descriptions of the surface and the thin film may be the same as above as long as they are not differently described hereinafter.

After the surface treatment, the method may further include heterocycling the region that may not be subjected to the surface treatment in the thin film. The heterocyclization may be Huisgen 1,3-dipolar cycloaddition. Hereinafter, a method of manufacturing the laminated structure will be described with reference to FIGS. 5(a)-5(c) and FIGS. 6(a)-6(c).

Figure 5:
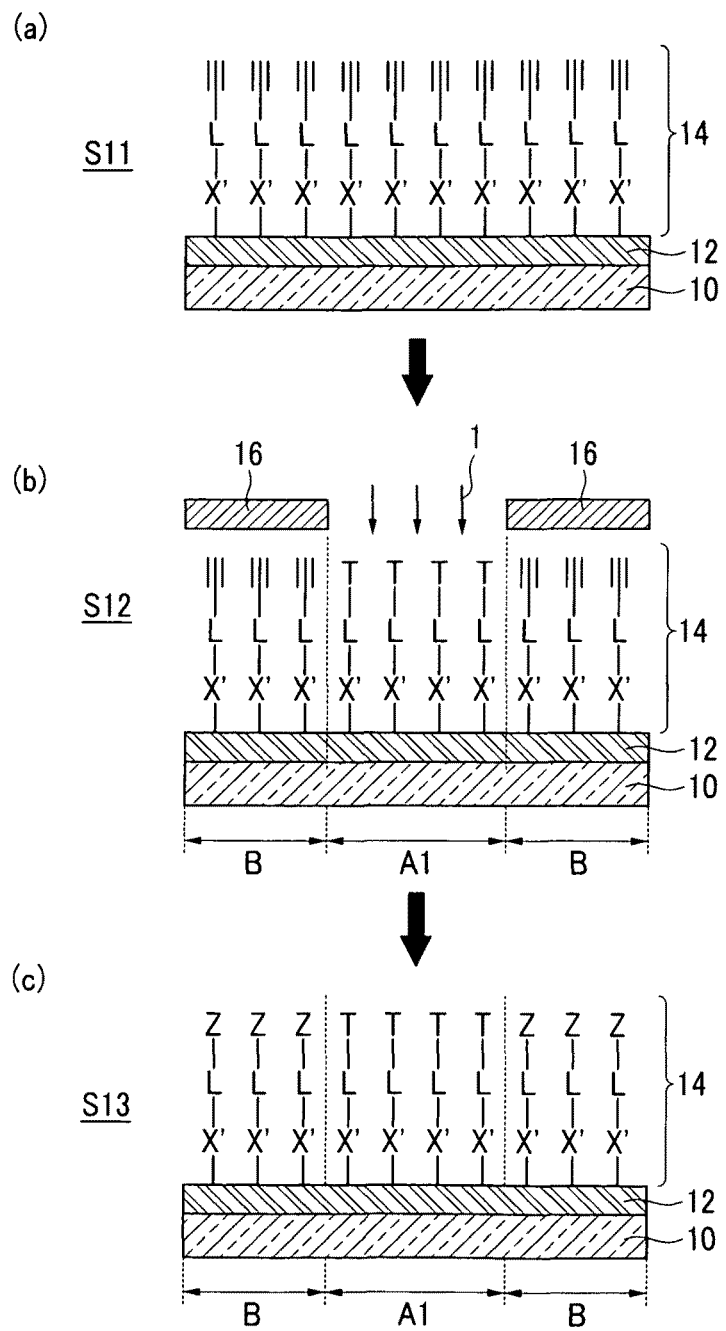

FIGS. 5(a)-5(c) is a cross-sectional view showing the process of manufacturing the laminated structure according to example embodiments.

Referring to FIG. 5(a), a lower layer 12 may be formed on a substrate 10, and an upper layer 14 including a group represented by Chemical Formula 2 may be formed on the lower layer 12 (S11). In example embodiments, the substrate 10 formed with the lower layer 12 may be immersed in a surface modifying agent including a compound represented by Chemical Formula 1. When the upper layer 14 is formed directly on the substrate 10 without the lower layer, the substrate 10 may be immersed in the surface modifying agent including the compound represented by Chemical Formula 1.

The upper layer 14 may be provided by binding the functional group X in the compound represented by Chemical Formula 1 with the lower layer 12. When the lower layer 12 is not formed on the substrate 10, the functional group X may be bound with the substrate 10.

Subsequently, in FIG. 5(b), a predetermined or given region of the upper layer 14 may be exposed to $H_2$ plasma 1 using a mask 16 (S12). When the predetermined or given region is exposed to $H_2$ plasma 1, the upper layer 14 may be partitioned to a second region B that has not been subjected to the surface treatment and a first region A1 that has been subjected to the surface treatment.

On the first region A1, the group represented by Chemical Formula 2 may be transferred to the group represented by Chemical Formula 3. Thereby, in FIG. 5(c), providing an upper layer 14 including a group represented by Chemical Formula 2 and a group represented by Chemical Formula 3 may be possible (S13).

When the second region B is subjected to heterocyclization, an ethynyl group present in one terminal end of the group represented by Chemical Formula 2 takes part in the reaction. When the group represented by Chemical Formula 2 is heterocyclized, the group represented by Chemical Formula 2 may be transferred to the group represented by Chemical Formula 5.

Because the obtained upper layer 14 has different surface characteristics, carrying out selective heterocyclization on a predetermined or given region may be possible. The heterocyclization may be performed with a solution process. For example, the second region B may be subjected to Huisgen 1,3-dipolar cycloaddition. Huisgen 1,3-dipolar cycloaddition may be performed by treating the second region B with a mixed solution of $N_3R$ (wherein, R may be selected from the group consisting of hydrogen, a $C_1$ to $C_{30}$ alkyl group, an aromatic group, a heterocyclic group, an amine group, an amide group, an ester group, and a combination thereof, or R may further include a substituent of a carboxylic acid group, a phosphoric acid group, a sulfonic acid group, an amine group, an aziridinium group, or a crown ether group to increase hydrophilicity) and Cu; or a mixed solution of $N_3R$ (wherein, R may be the same as described above), $CuBr_2$ or $CuSO_4$, and sodium ascorbate.

When the second region B undergoes Huisgen 1,3-dipolar cycloaddition, the group represented by Chemical Formula 2 may be transferred to a group represented by Chemical Formula 5. The terminal end of the group represented by Chemical Formula 5 has a functional group represented by Chemical Formula 6.

Thereby, providing an upper layer 14 including predetermined or given regions with the group represented by Chemical Formula 3 and the group represented by Chemical Formula 5, respectively, may be possible. Huisgen 1,3-dipolar cycloaddition may be well understood by a person of ordinary skill in the art, so a detailed description thereof will be omitted.

Figure 6:
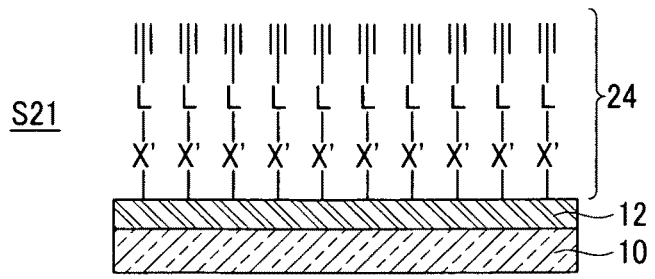
Figure 6:
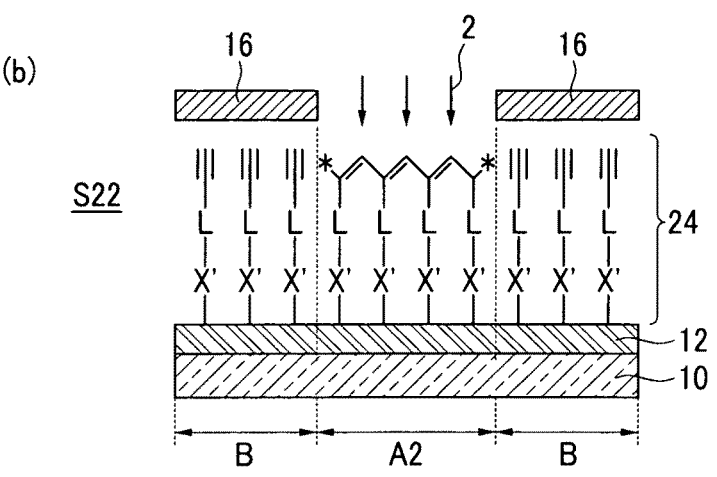
Figure 6:
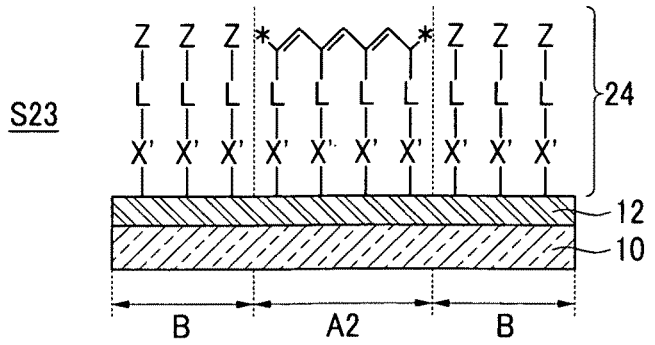

FIGS. 6(a)-6(c) is a cross-sectional view showing the process of manufacturing a laminated structure according to example embodiments. The process of manufacturing the laminated structure shown in FIGS. 6(a)-6(c) may be similar to the process of manufacturing the laminated structure shown in FIGS. 5(a)-5(c), but the step of surface treatment may be different. Description of the same processes of manufacturing the laminated structure shown in FIGS. 5(a)-5(c) will be omitted, and different processes between the two methods may be described as follows.

As described above, in FIG. 6(a), a lower layer 12 may be formed on the substrate 10, and an upper layer 24 including a group represented by Chemical Formula 2 may be formed on the lower layer 12 (S21).

In FIG. 6(b), a predetermined or given region of the upper layer 24 may be exposed to ultraviolet (UV) light 2 with a mask 16 (S22). When the predetermined or given region is exposed to ultraviolet (UV) light 2, the predetermined or given region may be partitioned to a first region A2 that may be subjected to the surface treatment and a second region B that may not be subjected to the surface treatment.

When ethynyl groups at one terminal end of the group represented by Chemical Formula 2 are exposed to ultraviolet (UV) light 2, the ethynyl groups may be polymerized by a radical reaction to transfer a group represented by Chemical Formula 2 of the first region A2 to a group represented by Chemical Formula 4.

Thereby, in FIG. 6(c), providing an upper layer 24 including predetermined or given regions with the group represented by Chemical Formula 2 and the group represented by Chemical Formula 4, respectively, may be possible (S23).

Subsequently, the second region B may be heterocyclized. Because the functional group represented by Chemical Formula 4a that may be present in the terminal end of the group represented by Chemical Formula 4 has no reactivity to heterocyclization, the heterocyclization may be carried out with a solution process.

Thereby, providing an upper layer 24 including predetermined or given regions with the group represented by Chemical Formula 4 and the group represented by Chemical Formula 5, respectively, may be possible. As a result, selectively providing different materials on the laminated structure may be possible.

Hereinafter, a transistor according to example embodiments will be described. The transistor according to example embodiments may include a surface, a thin film positioned on the surface and including a first region including a group represented by Chemical Formula 3 or a group represented by the following Chemical Formula 4, a second region including a group represented by the following Chemical Formula 5, a metal layer positioned on the second region, and an organic semiconductor positioned on the first region. Descriptions of the surface and the thin film may be the same as above if they are not described differently hereinafter.

The metal layer may include at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb), but may not be limited thereto.

According to example embodiments, the transistor may include a gate electrode positioned under the organic semiconductor, and a gate insulating layer positioned between the organic semiconductor and the gate electrode.

Figure 7:
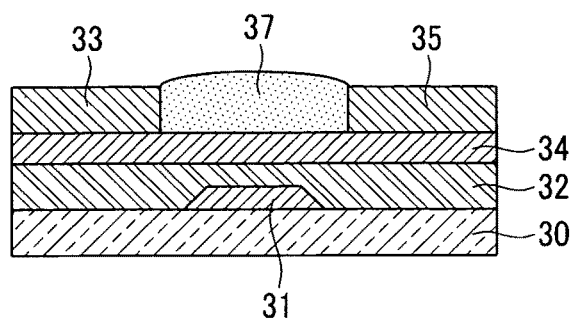

FIG. 7 is a schematic cross-sectional view showing the transistor.

Referring to FIG. 7, the transistor may have a gate electrode 31 formed on a substrate 30. A lower layer 32 may be formed to cover the gate electrode 31. The lower layer 32 may be an oxide layer. In addition, the lower layer 32 may be a gate insulating layer. An upper layer 34 may be formed on the lower layer 32. The upper layer 34 may be a self-assembled monolayer. A source electrode 33 and a drain electrode 35 may be formed on some regions on the upper layer 34, and an organic semiconductor 37 may be formed on a remaining region.

The upper layer 34 may have a selective binding characteristic with respect to a metal. Accordingly, various metals, e.g., gold (Au), silver (Ag), and copper (Cu), may be formed on the upper layer 34, and the metal may be used for the source electrode 33 and the drain electrode 35. When gold (Au), silver (Ag), and copper (Cu) are used for the source electrode 33 and the drain electrode 35, the work function value thereof may be similar to the work function value of an organic semiconductor, thereby improving charge transferring characteristics.

Figure 8:
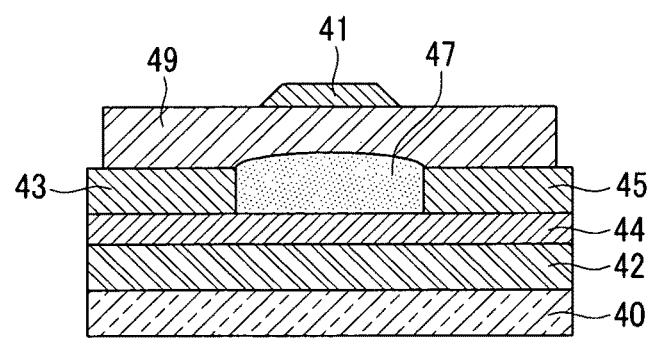

According to example embodiments, the transistor may include a gate electrode positioned on the organic semiconductor, and a gate insulating layer positioned between the organic semiconductor and the gate electrode. FIG. 8 is a schematic cross-sectional view showing the transistor.

Referring to FIG. 8, a lower layer 42 of the transistor may be provided on a substrate 40. The lower layer 42 may be an oxide layer. An upper layer 44 may be formed on the lower layer 42. The upper layer 44 may be a self-assembled monolayer. A source electrode 43 and a drain electrode 45 may be formed on some regions of the upper layer 44, and an organic semiconductor 47 may be formed on a remaining region. A gate insulation layer 49 may be formed on the whole surface including the source electrode 43, the organic semiconductor 47, and the drain electrode 45. A gate electrode 41 may be formed on the gate insulating layer 49.

The transistor according to example embodiments may be a thin film transistor. In the case of a thin film transistor, the thin film may have a thickness of several nm to several µm. In the case of using the upper layer according to example embodiments as a self-assembled monolayer, the effects thereof may be the same as above. Hereinafter, example embodiments may be illustrated in more detail with reference to examples. However, they are example embodiments and are not limiting.

EXAMPLES

Example 1

Manufacturing Laminated Structure

A silicon oxide layer may be formed on a surface of a silicon wafer (Si wafer) in accordance with heat treatment. The silicon oxide layer has a thickness of 300 Å.

The silicon wafer formed with silicon oxide layer may be immersed in a solution in which 400 µl 7-octynyltrichlorosilane may be dissolved in 200 ml of hexane, for 20 minutes. As a result, a self-assembled monolayer of a 7-octynyl trichlorosilyl group may be formed on the silicon oxide layer of the silicon wafer.

The silicon wafer formed with the self-assembled monolayer may be subjected to $H_2$ plasma treatment using a mask. On the exposure region treated with $H_2$ plasma, the terminal ethynyl group may be transferred mostly to an ethyl group and partially to an ethenyl group.

Figure 9:
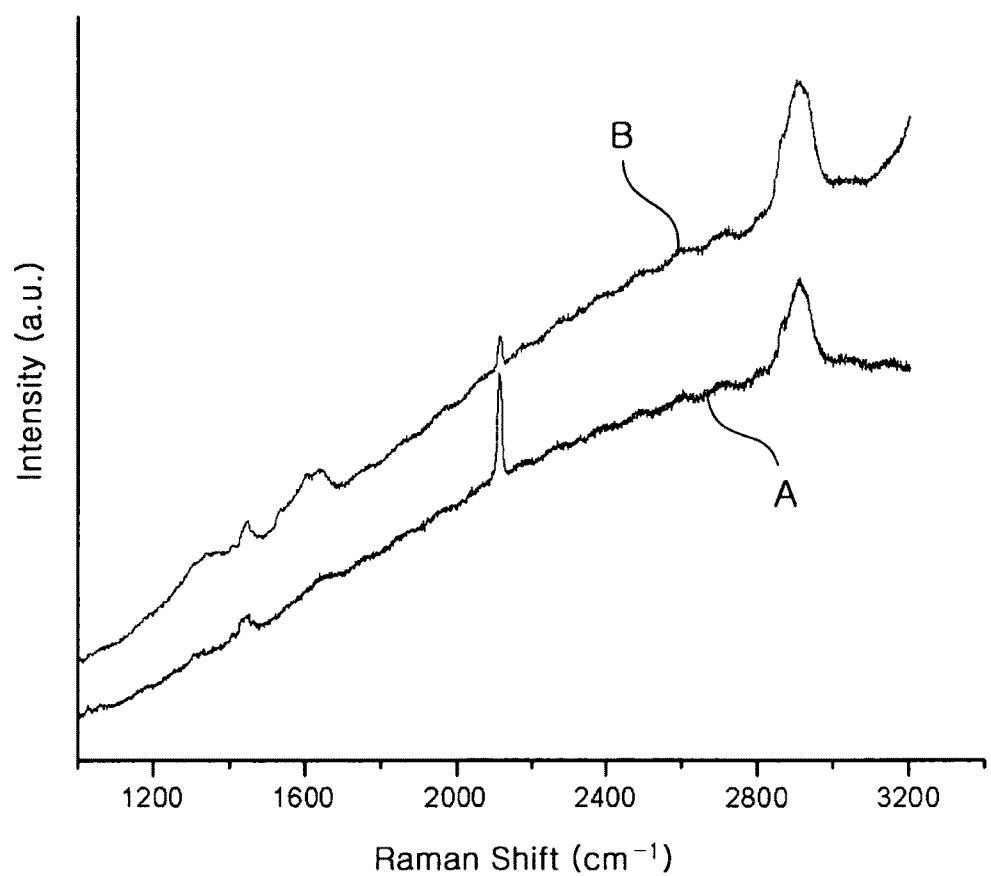

FIG. 9 shows Raman spectra before and after the $H_2$ plasma treatment. In FIG. 9, A refers to the Raman spectrum before the plasma treatment, and B refers to the Raman spectrum after the plasma treatment.

As shown in FIG. 9, a C—C stretching peak of approximate $2150\ cm^{-1}$, which represents a triple bond found before the $H_2$ plasma treatment, may be decreased after the $H_2$ plasma treatment. Instead, a C—H stretching peak of about $2900\ cm^{-1}$ may be increased. Thereby, the ethynyl group of exposure part may be transferred to an ethyl group or an ethenyl group.

The mask may be removed, and the silicon wafer may be immersed in 200 ml of a dimethyl formamide solution in which 350 mg of $NaN_3$, 40 µg of $CuBr_2$, and 2.4 g of sodium ascorbate may be mixed, for 24 hours. Thereby, the terminal ethynyl group of the non-exposed region may be transferred to a 1,2,3-triazole group through Huisgen 1,3-dipolar cycloaddition. Thereby, a laminated structure according to example embodiments may be provided.

Example 2

Manufacturing Copper (Cu)-Deposited Laminated Structure

Copper (Cu) may be deposited on a self-assembled monolayer including a 1,2,3-triazole group of the silicon wafer obtained from Example 1 at a deposition speed of 1.0 Å/sec according to a thermal evaporation method. The copper (Cu) has a deposition thickness of 700 Å. Thereby, a copper (Cu)-deposited laminated structure may be provided.

Comparative Example 1

Manufacturing Copper (Cu)-Deposited Substrate

A silicon oxide layer may be formed on the surface of a silicon wafer according to a heat treatment method. The obtained silicon oxide layer has a thickness of 300 Å.

Copper (Cu) may be deposited on the silicon oxide layer at a deposition speed of 1.0 Å/sec according to a thermal evaporation method. The copper (Cu) has a deposition thickness of 700 Å. Thereby, a copper (Cu)-deposited silicon wafer is provided.

Example 3

Manufacturing Transistor Using Copper (Cu)

A copper (Cu)-deposited laminated structure may be manufactured in accordance with the same processes as in Examples 1 and 2, except that silicon doped with phosphorus (P) may be deposited on a part of a silicon wafer (Si wafer) before a silicon oxide layer may be formed on the surface of the silicon wafer. A transistor having the structure shown in FIG. 7 may be manufactured by evaporating pentacene on the region without deposited copper (Cu) in the laminated structure.

Example 4

Manufacturing Transistor Using Gold (Au)

A transistor having the structure shown in FIG. 7 may be manufactured in accordance with the same process as in Example 3, except that gold (Au) may be used instead of copper (Cu).

Example 5

Manufacturing Transistor Using Silver (Ag)

A transistor having a structure shown in FIG. 7 may be manufactured in accordance with the same process as in Example 3, except that silver (Ag) may be used instead of copper (Cu).

Experimental Example 1

Comparing Deposition Characteristics of Copper (Cu) on Substrate

Figure 10A:
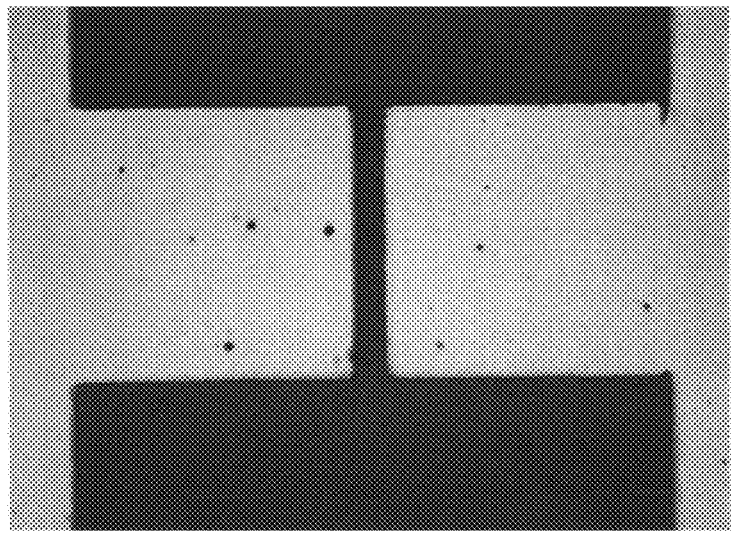
FIG. 10A is an optical photograph showing the results of copper (Cu) deposition characteristics in the laminated structure obtained from Example 2.
Figure 10B:
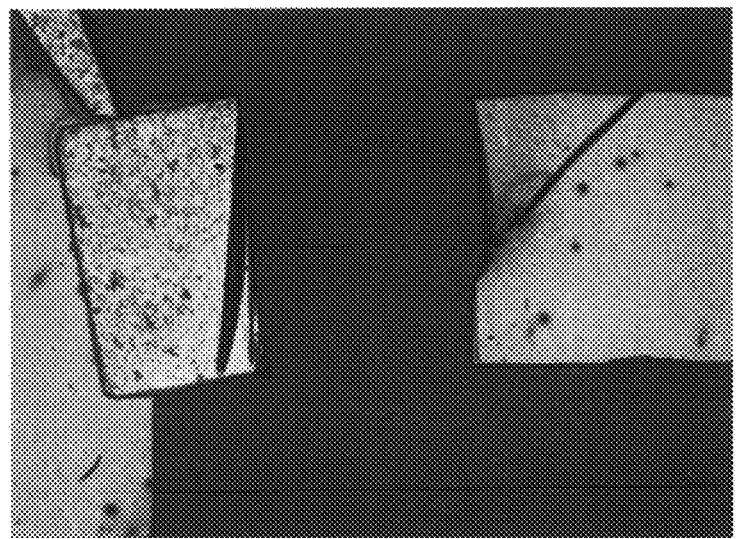
FIG. 10B is an optical photograph showing the results of copper (Cu) deposition characteristics in the laminated structure obtained from Comparative Example 1.

Each of the silicon wafers obtained from Example 2 and the silicon wafer obtained from Comparative Example 1 may be immersed in an octyl trichlorosilane (OTS) solution in which 40 ml of hexane may be mixed with 200 µl of OTS, for 20 minutes, and may be taken out to dry. FIGS. 10A and 10B show photographs taken after being dried. FIG. 10A may be an optical photograph for Example 2, and FIG. 10B may be an optical photograph for Comparative Example 1. As shown in FIG. 10A, the laminated structure obtained from Example 2 may not be peeled off during OTS solution treatment, and maintains a stable copper (Cu)-deposition state. Thereby, the laminated structure according to example embodiments has improved copper (Cu) deposition characteristics.

Experimental Example 2

Comparing Characteristics of Transistor

Using a measuring device of a semiconductor characterization system (4200-SCS) manufactured by KEITHLEY, each transistor obtained from Example 3 and Example 4 may be applied with a −10V bias voltage and a −40V bias voltage to determine the current transfer characteristics of the transistors.

Figure 11A:
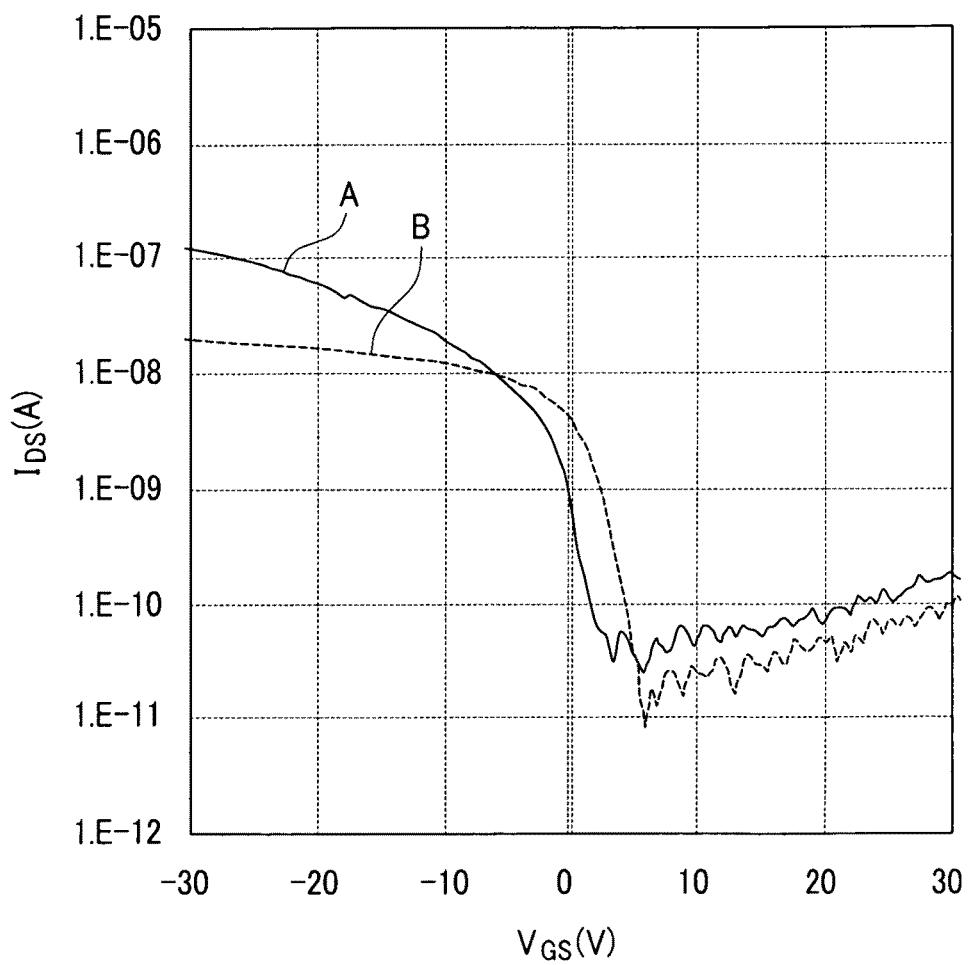
FIG. 11A is a graph showing $I_{DS}$-$V_{GS}$ curves of the transistor obtained from Example 4.
Figure 11B:
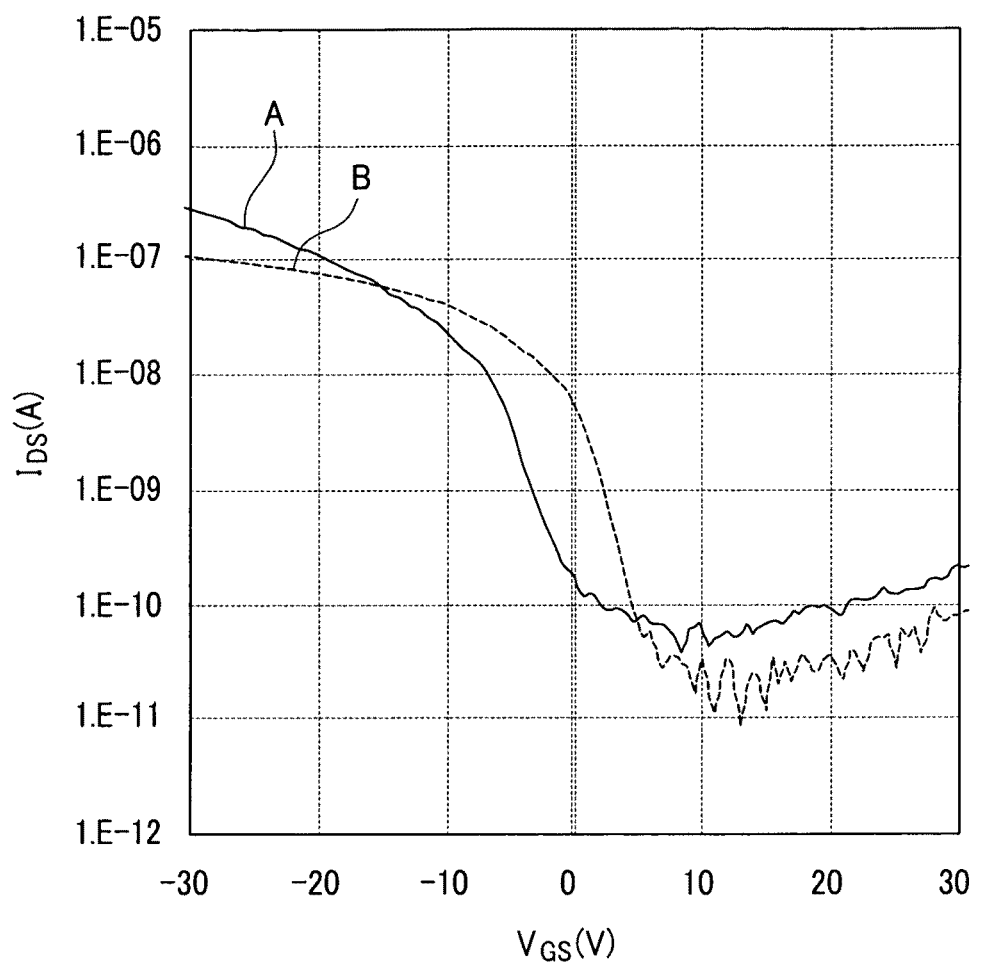
FIG. 11B is a graph showing $I_{DS}$-$V_{GS}$ curves of the transistor obtained from Example 3.
Figure 11C:
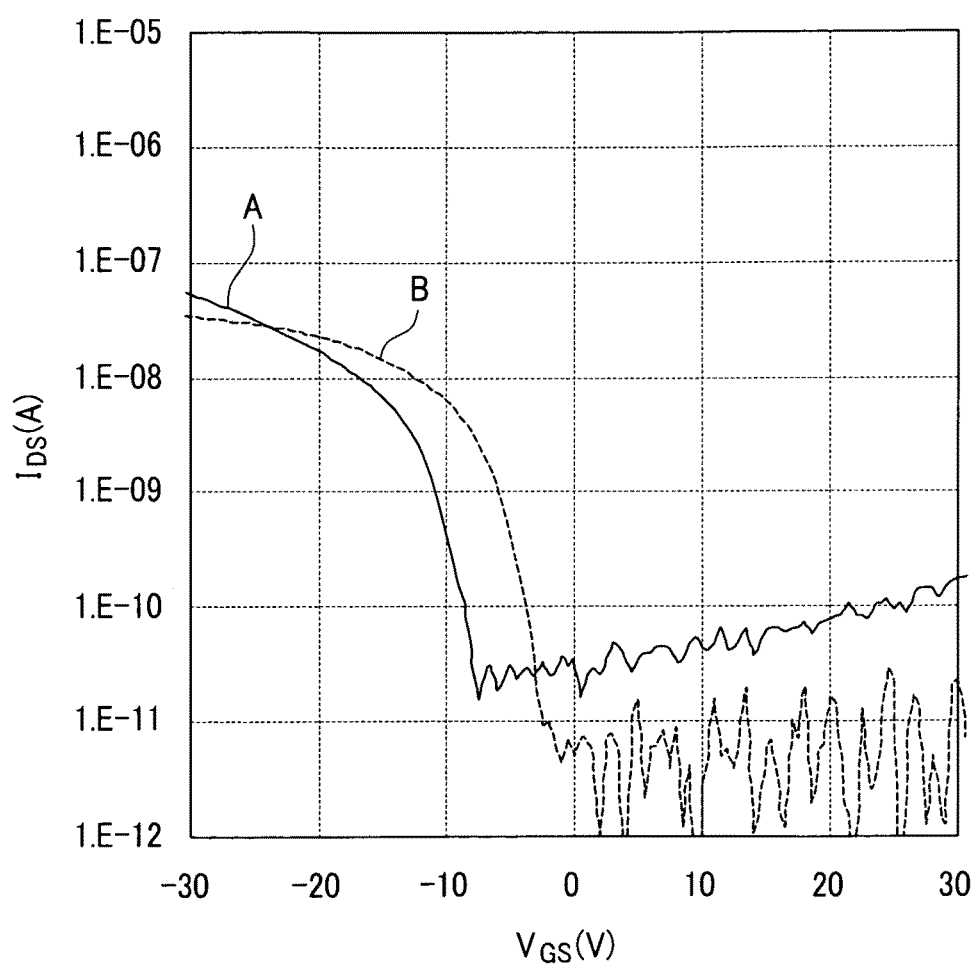

The results may be shown in FIGS. 11A, 11B, and 11C. FIGS. 11A, 11B, and 11C may be graphs showing $I_{DS}$-$V_{GS}$ curves, wherein FIG. 11A may be a graph showing the results of analyzing characteristics of the transistor obtained from Example 4, FIG. 11B may be a graph showing the results of analyzing characteristics of the transistor obtained from Example 3, and FIG. 11C may be a graph showing the results of analyzing characteristics of the transistor obtained from Example 5. In FIGS. 11A, 11B, and 11C, A represents the case in which a −40V bias voltage may be applied, and B represents the case in which a −10V bias voltage may be applied.

As shown in FIGS. 11A, 11B, and 11C, the characteristics of the transistor that has a source electrode and a drain electrode of copper (Cu) or silver (Ag) may not be remarkably different from the characteristics of the transistor that has a source electrode and a drain electrode of gold (Au).

Accordingly, easily depositing silver (Ag) and copper (Cu) as well as gold (Au) on the laminated structure by using the laminated structure according to example embodiments may be possible, and the characteristics may be improved in both cases of using them as an electrode of a transistor.

The laminated structure of example embodiments may be used in organic thin-film electronic devices, for example, thin film transistors (TFT), photovoltaic (PV) cells and/or sensors and/or biochip applications, where a surface patterning technique may be utilized to arrange many different template materials separately.

While example embodiments have been described in connection with what may be presently considered to be practical example embodiments, it may be to be understood that example embodiments may not be limited to the disclosed example embodiments, but, on the contrary, may be intended to cover various modifications and equivalent arrangements included within the spirit and scope of the appended claims.

What is claimed is:

1. A laminated structure comprising:
at least one thin film including a group selected from groups represented by one of Chemical Formula 2 through Chemical Formula 5, or a combination thereof:

[Chemical Formula 2]

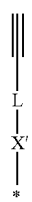

wherein, in the above Chemical Formula 2,
L is selected from the group consisting of a $C_1$ to $C_{30}$ alkylene group, a $C_1$ to $C_{30}$ perfluoroalkylene group, a linker represented by the following Chemical Formula 1a, an aromatic group, a heterocyclic group, an amine group, an amide group, and an ester group,

[Chemical Formula 1a]

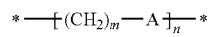

wherein, in the above Chemical Formula 1a,
A is selected from the group consisting of O, S, $NR_1$, $NHCO$, $SO_2$, $COO$, and $CO$, wherein $R_1$ is hydrogen or a $C_1$ to $C_3$ linear or branched alkyl group, m is an integer ranging from 1 to 3, and n is an integer ranging from 1 to 30, X' is a linker formed by binding to a functional group of a surface on which the at least one thin film is formed and is selected from the group consisting of a functional group represented by the following Chemical Formula 1b to Chemical Formula 1d, SH, CONHOH, COOH, OH, COSH, COSeH, SeH, $SO_3H$, CN, an amino group, and a phosphinyl group,

[Chemical Formula 1b]

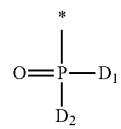

wherein, in the above Chemical Formula 1b,
$D_1$ and $D_2$ are the same or different from each other, and are independently selected from the group consisting of a halogen, a $C_1$ to $C_3$ linear or branched alkoxy group, and OH,

[Chemical Formula 1c]

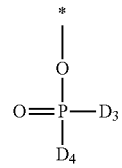

wherein, in the above Chemical Formula 1c,
$D_3$ and $D_4$ are the same or different from each other, and are independently selected from the group consisting of a halogen, OH, a $C_1$ to $C_3$ linear or branched alkoxy group, and $NR_2R_3$, wherein $R_2$ and $R_3$ are the same or different from each other and are independently a $C_1$ to $C_3$ linear or branched alkyl group, and

[Chemical Formula 1d]

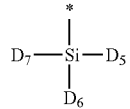

wherein, in the above Chemical Formula 1d,
$D_5$ to $D_7$ are the same or different from each other, and are independently selected from the group consisting of a halogen, OH, a $C_1$ to $C_3$ linear or branched alkoxy group, and a $C_1$ to $C_3$ linear or branched alkyl group, provided that $D_5$ to $D_7$ are not simultaneously an alkyl group,

[Chemical Formula 3]

wherein, in the above Chemical Formula 3,
L and X' are the same as defined in the above Chemical Formula 2, and T is an ethyl group or an ethenyl group,

[Chemical Formula 4]

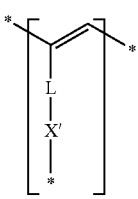

wherein, in the above Chemical Formula 4,
L and X' are the same as defined in the above Chemical Formula 2,

[Chemical Formula 5]

wherein, in the above Chemical Formula 5,
L and X' are the same as defined in the above Chemical Formula 2, and Z is selected from the group consisting of a triazole group, a benzotriazole group, an imidazole group, a benzimidazole group, a tetrazole group, a pyridine group, a pyrazole group, an isoxazole group, and an indolizinone group,
wherein the at least one thin film includes first and second thin films, the second thin film on a surface of the first thin film,
wherein the second thin film includes at least two regions having different surface characteristics from each other, and
wherein the at least two regions include a first region including a group represented by the one of Chemical Formula 3 and Chemical Formula 4, and a second region including a group represented by the one of Chemical Formula 2 and Chemical Formula 5, provided that when a first region includes a group represented by Chemical Formula 4 and the second region includes a group represented by Chemical Formula 2, then X' of Chemical Formula 2 is selected from the group consisting of a functional group represented by Chemical Formula 1b, Chemical Formula 1c, SH, CONHOH, COOH, OH, COSH, COSeH, SeH, $SO_3H$, CN, an amino group, and a phosphinyl group.

2. The laminated structure of claim 1, wherein the first thin film includes an inorganic material, an organic material, or a composite of an inorganic material and an organic material.

3. The laminated structure of claim 2, wherein the organic material includes plastic and the inorganic material includes at least one of a glass and a metal.

4. The laminated structure of claim 2, wherein the first thin film includes one selected from the group consisting of silicon (Si), aluminum (Al), indium (In), tin (Sn), zirconium (Zr), hafnium (Hf), lanthanum (La), gadolinium (Gd), yttrium (Y), titanium (Ti), a combination thereof, and an oxide thereof.

5. The laminated structure of claim 2, wherein the first and second thin films are on a substrate, the substrate being formed of the same material as the first thin film.

6. The laminated structure of claim 1, wherein the first region has a group represented by Chemical Formula 3 and a second region has a group represented by Chemical Formula 2.

7. The laminated structure of claim 6, wherein a surface of the first region is treated with $H_2$ plasma and a surface of the second region is not treated with $H_2$ plasma.

8. The laminated structure of claim 1, wherein the first region has a group represented by Chemical Formula 3, and a second region has a group represented by Chemical Formula 5.

9. The laminated structure of claim 8, wherein a surface of the second region includes a heterocyclized surface and the first region includes a non-heterocyclized surface.

10. The laminated structure of claim 9, further comprising:
a metal layer on the heterocyclized second region, the metal layer including at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb).

11. The laminated structure of claim 9, further comprising:
an organic material bound to the non-heterocyclized first region, the organic material including at least one of pentacene, heteroacene, oligothiophenes, polythiophenes, polyphenylenevinylene and arylene carbodiimides.

12. The laminated structure of claim 1, wherein the first region has a group represented by Chemical Formula 4 and a second region has a group represented by Chemical Formula 2.

13. The laminated structure of claim 12, wherein the first region includes a UV light-treated surface and the second region includes a non-UV light-treated surface.

14. The laminated structure of claim 1, wherein the first region has a group represented by Chemical Formula 4 and a second region has a group represented by Chemical Formula 5.

15. The laminated structure of claim 14, wherein a surface of the second region includes a heterocyclized surface and the first region includes a non-heterocyclized surface.

16. A transistor comprising:
at least one thin film having a first region including a group represented by the one of the following Chemical Formula 3 and the following Chemical Formula 4, and a second region including a group represented by the following Chemical Formula 5;
a metal layer on the second region; and
an organic semiconductor on the first region,

[Chemical Formula 3]

wherein, in the above Chemical Formula 3,

L is selected from the group consisting of a $C_1$ to $C_{30}$ alkylene group, a $C_1$ to $C_{30}$ perfluoroalkylene group, a linker represented by the following Chemical Formula 1a, an aromatic group, a heterocyclic group, an amine group, an amide group, and an ester group,

[Chemical Formula 1a]

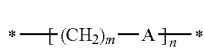

wherein, in the above Chemical Formula 1a,

A is selected from the group consisting of O, S, $NR_2$, NHCO, $SO_2$, COO, and CO, wherein $R_1$ is hydrogen or a $C_1$ to $C_3$ linear or branched alkyl group, m is an integer ranging from 1 to 3, and n is an integer ranging from 1 to 30, X' is a linker formed by binding to a functional group of a surface on which the at least one thin film is formed and is selected from the group consisting of a functional group represented by the following Chemical Formula 1b to Chemical Formula 1d, SH, CONHOH, COOH, OH, COSH, COSeH, SeH, $SO_3H$, CN, an amino group, and a phosphinyl group,

[Chemical Formula 1b]

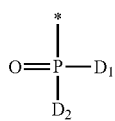

wherein, in the above Chemical Formula 1b, $D_1$ and $D_2$ are the same or different from each other, and are independently selected from the group consisting of a halogen, a $C_1$ to $C_3$ linear or branched alkoxy group, and OH,

[Chemical Formula 1c]

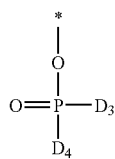

wherein, in the above Chemical Formula 1c, $D_3$ and $D_4$ are the same or different from each other, and are independently selected from the group consisting of a halogen, OH, a $C_1$ to $C_3$ linear or branched alkoxy group, and $NR_2R_3$, wherein $R_2$ and $R_3$ are the same or different from each other and are independently a $C_1$ to $C_3$ linear or branched alkyl group, and

[Chemical Formula 1d]

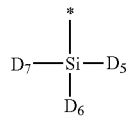

wherein, in the above Chemical Formula 1d, $D_5$ to $D_7$ are the same or different from each other, and are independently selected from the group consisting of a halogen, OH, a $C_1$ to $C_3$ linear or branched alkoxy group, and a $C_1$ to $C_3$ linear or branched alkyl group, provided that $D_5$ to $D_7$ are not simultaneously an alkyl group, and T is an ethyl group or an ethenyl group,

[Chemical Formula 4]

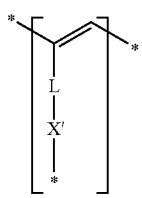

wherein, in the above Chemical Formula 4,

L and X' are the same as defined in the above Chemical Formula 3,

[Chemical Formula 5]

wherein, in the above Chemical Formula 5,

L and X' are the same as defined in the above Chemical Formula 3, and Z is selected from the group consisting of a triazole group, a benzotriazole group, an imidazole group, a benzimidazole group, a tetrazole group, a pyridine group, a pyrazole group, an isoxazole group, and an indolizinone group.

17. The transistor of claim 16, wherein the at least one thin film includes first and second thin films, the second thin film on a surface of the first thin film.

18. The transistor of claim 17, wherein the second thin film comprises the first and second regions having different surface characteristics from each other.

19. The transistor of claim 17, wherein the first thin film includes an inorganic material, an organic material, or a composite of an inorganic material and an organic material.

20. The transistor of claim 19, wherein the organic material includes plastic and the inorganic material includes at least one of a glass and a metal.

21. The transistor of claim 19, wherein the first thin film includes one selected from the group consisting of silicon (Si), aluminum (Al), indium (In), tin (Sn), zirconium (Zr), hafnium (Hf), lanthanum (La), gadolinium (Gd), yttrium (Y), titanium (Ti), a combination thereof, and an oxide thereof.

22. The transistor of claim 19, wherein the first and second thin films are on a substrate, the substrate being formed of the same material as the first thin film.

23. The transistor of claim 18, wherein the first region has a group represented by Chemical Formula 3 and the second region has a group represented by Chemical Formula 5.

24. The transistor of claim 23, wherein a surface of the second region includes a heterocyclized surface and the first region includes a non-heterocyclized surface.

25. The transistor of claim 24, further comprising:
a metal layer on the heterocyclized second region, the metal layer including at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb).

26. The transistor of claim 24, further comprising:
an organic material bound to the non-heterocyclized first region, the organic material including at least one of pentacene, heteroacene, oligothiophenes, polythiophenes, polyphenylenevinylene and arylene carbodiimides.

27. The transistor of claim 18, wherein the first region has a group represented by Chemical Formula 4 and the second region has a group represented by Chemical Formula 5.

28. The transistor of claim 27, wherein a surface of the second region includes a heterocyclized surface and the first region includes a non-heterocyclized surface.

29. The transistor of claim 16, wherein the organic semiconductor is on a gate electrode and a gate insulating layer is between the organic semiconductor and the gate electrode.

30. The transistor of claim 16, further comprising:
a gate electrode on the organic semiconductor; and
a gate insulating layer between the organic semiconductor and the gate electrode.

31. The transistor of claim 16, wherein the metal layer includes at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb).

32. A method of manufacturing a laminated structure, comprising:
forming at least one thin film having a first region and a second region, each of the first region and the second region having a group represented by the following Chemical Formula 2:

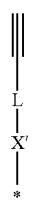

[Chemical Formula 2]

wherein, in the above Chemical Formula 2,
L is selected from the group consisting of an octenylene group, a $C_1$ to $C_{30}$ perfluoroalkylene group, a linker represented by the following Chemical Formula 1a, an aromatic group, a heterocyclic group, an amine group, an amide group, and an ester group,

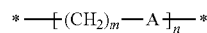

[Chemical Formula 1a]

wherein, in the above Chemical Formula 1a,
A is selected from the group consisting of O, S, $NR_1$, NHCO, $SO_2$, COO, and CO, wherein $R_1$ is hydrogen or a $C_1$ to $C_3$ linear or branched alkyl group, m is an integer ranging from 1 to 3, and n is an integer ranging from 1 to 30,
X' is a linker formed by binding to a functional group of a surface on which the at least one thin film is formed and is selected from the group consisting of a functional group represented by the following Chemical Formula 1b to Chemical Formula 1d, SH, CONHOH, COOH, OH, COSH, COSeH, SeH, $SO_3H$, CN, an amino group, and a phosphinyl group,

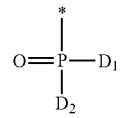

[Chemical Formula 1b]

wherein, in the above Chemical Formula 1b,
$D_1$ and $D_2$ are the same or different from each other, and are independently selected from the group consisting of a halogen, a $C_1$ to $C_3$ linear or branched alkoxy group, and OH,

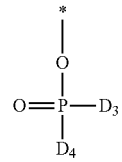

[Chemical Formula 1c]

wherein, in the above Chemical Formula 1c,
$D_3$ and $D_4$ are the same or different from each other, and are independently selected from the group consisting of a halogen, OH, a $C_1$ to $C_3$ linear or branched alkoxy group, and $NR_2R_3$, wherein $R_2$ and $R_3$ are the same or different from each other and are independently a $C_1$ to $C_3$ linear or branched alkyl group, and

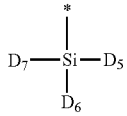

[Chemical Formula 1d]

wherein, in the above Chemical Formula 1d,
$D_5$ to $D_7$ are the same or different from each other, and are independently selected from the group consisting of a halogen, OH, a $C_1$ to $C_3$ linear or branched alkoxy group, and a $C_1$ to $C_3$ linear or branched alkyl group, provided that $D_5$ to $D_7$ are not simultaneously an alkyl group; and
performing a surface treatment on the first region of the at least one thin film to convert the group of Chemical Formula 2 into a group of Chemical Formula 3 or 4:

[Chemical Formula 3]

wherein, in the above Chemical Formula 3,
L and X' are the same as defined in the above Chemical Formula 2, and T is an ethyl group or an ethenyl group,

[Chemical Formula 4]

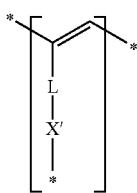

wherein, in the above Chemical Formula 4,
L and X' are the same as defined in the above Chemical Formula 2,
provided that when the group of the first region is converted into a group represented by Chemical Formula 4, then X' of Chemical Formula 2 is selected from the group consisting of a functional group represented by Chemical Formula 1b, Chemical Formula 1c, SH, CONHOH, COOH, OH, COSH, COSeH, SeH, $SO_3H$, CN, an amino group, and a phosphinyl group.

33. The method of claim 32, wherein forming the at least one thin film includes forming a second thin film on a surface of the first thin film and the surface treatment is performed on the first region of the second thin film.

34. The method of claim 33, wherein performing the surface treatment includes exposing the first region of the second thin film to $H_2$ plasma or ultraviolet (UV) light.

35. The method of claim 34, further comprising:
converting the group of the second region of the second thin film not subjected to the surface treatment to a group according to Chemical Formula 5 after performing the surface treatment:

[Chemical Formula 5]

wherein, in the above Chemical Formula 5,
L and X' are the same as defined in the above Chemical Formula 2, and Z is selected from the group consisting of a triazole group, a benzotriazole group, an imidazole group, a benzimidazole group, a tetrazole group, a pyridine group, a pyrazole group, an isoxazole group, and an indolizinone group.

36. The method of claim 35, wherein converting the group of the second region of the second thin film not subjected to the surface treatment to the group according to Chemical Formula 5 includes Huisgen 1,3-dipolar cycloaddition.

37. The method of claim 33, further comprising:
forming the first thin film on a substrate, the substrate being formed of the same material as the first thin film.

38. The method of claim 36, wherein a surface of the first region of the second thin film is exposed to $H_2$ plasma using a mask and a surface of the second region is not exposed to $H_2$ plasma, the first region having a group represented by Chemical Formula 3 and the second region having a group represented by Chemical Formula 2.

39. The method of claim 36, further comprising:
forming a metal layer on the converted second region, the metal layer including at least one metal selected from the group consisting of copper (Cu), gold (Au), silver (Ag), molybdenum (Mo), nickel (Ni), chromium (Cr), titanium (Ti), tin (Sn), indium (In), cobalt (Co), aluminum (Al), platinum (Pt), and niobium (Nb).

40. The method of claim 36, wherein a surface of the first region is exposed to ultraviolet (UV) light using a mask and a surface of the second region is not exposed to UV light, the first region having a group represented by Chemical Formula 4 and the second region having a group represented by Chemical Formula 2.

* * * * *